United States Patent
Zhou et al.

(10) Patent No.: US 10,461,390 B2
(45) Date of Patent: Oct. 29, 2019

(54) PHASE SHIFTER AND FEED NETWORK INCLUDING A MICROSTRIP/COPLANAR WAVEGUIDE COUPLING STRUCTURE HAVING VERTICAL PROJECTIONS

(71) Applicant: HUAWEI TECHNOLOGIES CO., LTD., Shenzhen, Guangdong (CN)

(72) Inventors: Jie Zhou, Chengdu (CN); Huizhen Qian, Chengdu (CN); Xun Luo, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/634,226

(22) Filed: Jun. 27, 2017

(65) Prior Publication Data

US 2017/0373363 A1    Dec. 28, 2017

(30) Foreign Application Priority Data

Jun. 28, 2016    (CN) .......................... 2016 1 0490285

(51) Int. Cl.
*H01P 5/12* (2006.01)
*H01P 1/18* (2006.01)
(Continued)

(52) U.S. Cl.
CPC ................ *H01P 5/12* (2013.01); *H01P 1/184* (2013.01); *H01P 3/003* (2013.01); *H01P 5/02* (2013.01);
(Continued)

(58) Field of Classification Search
CPC .. H01P 1/184; H01P 1/18; H01P 9/006; H01P 5/12
(Continued)

(56) References Cited

U.S. PATENT DOCUMENTS 5,432,487 A    7/1995  Dydyk
7,595,753 B2   9/2009  Ratni
(Continued)

FOREIGN PATENT DOCUMENTS

CN    101277139 A    10/2008

OTHER PUBLICATIONS

Chinese Office Action dated Jun. 1, 2018, in corresponding Chinese Patent Application No. 201610490285.0, 7 pgs.
(Continued)

*Primary Examiner* — Benny T Lee
(74) *Attorney, Agent, or Firm* — Fish & Richardson P.C.

(57) ABSTRACT

The present invention relates to the field of communications technologies and discloses a phase shifter and a feed network. The phase shifter includes at least one phase shift component. The phase shift component includes a substrate, a microstrip coupling structure disposed on a first plane of the substrate, a microstrip transmission line connected to and coplanar with the microstrip coupling structure, and a microstrip/coplanar-waveguide coupling structure, where the microstrip/coplanar-waveguide coupling structure includes a microstrip connected to and coplanar with the microstrip transmission line, and a coplanar waveguide disposed opposite to the microstrip on the substrate and coupled with the microstrip. A phase shifter using a microstrip/coplanar-waveguide coupling structure has a small volume and costs low, thereby facilitating feed network design.

16 Claims, 9 Drawing Sheets

(51) Int. Cl.

| | | |
|---|---|---|
| *H01P 5/08* | (2006.01) | |
| *H01Q 21/00* | (2006.01) | |
| *H01P 3/00* | (2006.01) | |
| *H01P 5/02* | (2006.01) | |
| *H03H 7/18* | (2006.01) | |
| *H01Q 3/34* | (2006.01) | |
| *H01Q 21/22* | (2006.01) | |

(52) U.S. Cl.
CPC ........... *H01P 5/08* (2013.01); *H01Q 21/0075* (2013.01); *H03H 7/18* (2013.01); *H01Q 3/34* (2013.01); *H01Q 21/22* (2013.01)

(58) Field of Classification Search
USPC .................................................. 333/161, 136
See application file for complete search history.

(56) References Cited

U.S. PATENT DOCUMENTS

| | | | |
|---|---|---|---|
| 2008/0238774 A1 | 10/2008 | Ratni | |
| 2014/0191822 A1* | 7/2014 | Cisco et al. | .............. H01P 1/18 333/161 |
| 2014/0232484 A1* | 8/2014 | Sakasai et al. | ......... H01P 1/184 333/161 |

OTHER PUBLICATIONS

Extended European Search Report dated Oct. 11, 2017 in corresponding European Patent Application No. 17178343.4.

Ramos Quirarte J L et al.: "Novel Schiffman Phase Shifters," IEEE Transactions on Microwave Theory and Techniques, Plenum, vol. 41, No. 1, Jan. 1, 1993 pp. 9-14, XP000358551.

Strauss G et al.: "A Novel Concept for MM-Wave MMIC Interconnects and Packaging," IEEE MTT-S International Microwave Symposium Digest, IEEE, US, vol. 2, May 23, 1994, pp. 1141-1144, XP000516749.

Yuk Shing Wong et al.: "Multi-way and Poly-Phase Aligned Feed-Forward Differential Phase Shifters, "IEEE Transactions on Microwave Theory and Techniques, vol. 62, No. 6, pp. 1312-1321, Jun. 2014.

Xing Yu Pu et al.: "Novel Multi-way Broadband Differential Phase Shifter With Uniform Reference Line Using Coupled Line Structure," IEEE Microwave and Wireless Components Letters, vol. 25, No. 3, Mar. 2015.

"90-Degree Differential Phase Shifters Using Meander-Line Networks," Hiroshi Iwakura et al., Electronics and Communications in Japan, Part 1, vol. 68, No. 10, 1985, Oct. 1, 1984, pp. 55-62, XP055492600.

"A New Structure of Microwave Ultrawide-Band Differential Phase Shifter," Meschanov V P et al, IEEE Transactions on Microwave Theory and Techniques, Plenum, USA, vol. 42, No. 5, May 1, 1994, pp. 762-765, XP000451073.

"All-pass dispersion synthesis using microwave C-sections," Shulab Gupta et al., International Journal of Circuit Theory and Applications, vol. 42, No. 12, May 24, 2013, pp. 1228-1245, XP055492741.

European Communication pursuant to Article 94(3) EPC dated Jul. 26, 2018 in corresponding European Patent Application No. 17178343. 4.

* cited by examiner

PHASE SHIFTER AND FEED NETWORK INCLUDING A MICROSTRIP/COPLANAR WAVEGUIDE COUPLING STRUCTURE HAVING VERTICAL PROJECTIONS

CROSS-REFERENCE TO RELATED APPLICATIONS

This application claims priority to Chinese Patent Application No. 201610490285.0, filed on Jun. 28, 2016, which is hereby incorporated by reference in its entirety.

TECHNICAL FIELD

The present invention relates to the field of communications technologies, and in particular, to a phase shifter and a feed network.

BACKGROUND

With the development of modern communications technologies, a communications system has an increasingly high requirement on communication efficiency. To achieve faster and more accurate data transmission, the communications system mostly uses an MIMO (multiple-input multiple-output) technology and a phase array technology. A phase shifter with high-precision phase control plays a key role in the MIMO and phase array technologies. Most existing phase shifters use a microstrip coupling manner. A microstrip is a common signal transmission line. In addition, a coplanar waveguideis also a signal transmission line.

The phase shifter includes at least two structures: a reference structure and a phase shift structure. The reference structure implements a phase shift $\Phi°$ at a frequency, and the phase shift structure implements a phase shift $(\Phi+\psi)°$ at the frequency. A phase difference $\psi°$ between the two structures is a required differential phase shift. When the phase difference $\psi°$ between the reference structure and the phase shift structure within a passband is a fixed value, a constant differential phase shift can be implemented within the passband.

However, a phase shifter in the prior art has a relatively large size or volume and high cost. This is not helpful for design of a multi-phase feed network including a phase shifter.

SUMMARY

Embodiments of the present invention provide a phase shifter and a feed network, to reduce a volume of a phase shifter and facilitate feed network design and processing.

An embodiment of the present invention provides a phase shifter, where the phase shifter includes at least one phase shift component, where the phase shift component includes: a substrate, a microstrip coupling structure disposed on a first plane of the substrate, a microstrip transmission line connected to the microstrip coupling structure and disposed on the first plane, and a microstrip/coplanar-waveguide coupling structure, where the microstrip/coplanar-waveguide coupling structure includes a microstrip connected to the microstrip transmission line and disposed on the first plane, and a coplanar waveguide disposed on a second plane of the substrate and coupled with the microstrip, where the second plane is opposite to the first plane; and the phase shifter further includes a microstrip input/output port connected to the microstrip coupling structure and a coplanar waveguide input/output port connected to the coplanar waveguide, where a phase shift generated from a signal passing between the microstrip input/output port and the coplanar waveguide input/output port is a phase shift of the phase shift component.

In the foregoing technical solution, a reference structure and a phase shift structure can have different phases by adjusting a coupling width and a coupling gap of the microstrip coupling structure, a length of the microstrip transmission line, or a coupling width of the microstrip/coplanar-waveguide coupling structure, making an adjustment of a phase shift angle convenient. In addition, the phase shifter using the microstrip/coplanar-waveguide coupling structure has a small volume and costs low, thereby facilitating feed network design.

In a specific embodiment, the microstrip coupling structure is in form of a U-shaped microstrip, and a coupling width between two side walls of the U-shaped microstrip is not greater than eight times a thickness of the used substrate. The U-shaped microstrip is used to generate coupling between the two side walls of the U-shaped microstrip. To ensure coupling generated between the two side walls, a width between the two side walls is not greater than eight times a thickness of the substrate, such as twice, four times, six times, eight times, or other multiples.

In addition, in a preferred embodiment, the phase shifter further includes a capacitor coupled between the two side walls of the U-shaped microstrip. The capacitor may be a fixed capacitor or a variable capacitor. A phase shift of each output branch can be fine-tuned by using the disposed capacitor, so as to further change a phase output of the phase shifter.

In a specific embodiment, a side wall length of the microstrip coupling structure in the reference structure is $0.25\lambda c$, where when the phase shifter operates at a center frequency of fc, $\lambda c$ is a wavelength of a signal whose frequency is fc and that is transmitted over a substrate dielectric.

In addition, the coplanar waveguide includes a first metal layer and a first ground layer located on two sides of the first metal layer, and a first gap exists between the first metal layer and the first ground layer; and the coplanar waveguide input/output port includes a second metal layer and a second ground layer located on two sides of the second metal layer, and a second gap exists between the second metal layer and the second ground layer, where the first metal layer and the second metal layer are connected, the first ground layer and the second ground layer are connected, and the first gap and the second gap are connected.

In a solution of a specific embodiment, in the microstrip/coplanar-waveguide coupling structure, the microstrip on the first plane and a vertical projection of the first metal layer of the coplanar waveguide on the first plane completely overlap, partially overlap, or are staggered.

In a preferred solution, the phase shifter further includes a capacitor disposed between the microstrip and the coplanar waveguide in the microstrip/coplanar-waveguide coupling structure. The capacitor may be a fixed capacitor or a variable capacitor. A phase shift of each output branch can be fine-tuned by using the disposed capacitor, so as to further change a phase output of the phase shifter.

In addition, in this embodiment, the at least one phase shift component includes a reference structure and a phase shift structure, where the reference structure, serving as a first phase shift component, is configured to generate a first phase shift, the phase shift structure, serving as a second phase shift component, is configured to generate a second phase shift, and the first phase shift and the second phase shift are used to generate a differential phase shift, and the differential phase shift is a phase shift of the phase shifter. A phase shift of the phase shifter is implemented by using the phase shift structure and the reference structure.

In this embodiment, an impedance of the microstrip input/output port is 50 ohm, and an impedance of the coplanar waveguide input/output port is 50 ohm. An impedance of the microstrip transmission line is 50 ohm.

An embodiment of the present invention further provides a feed network, where the feed network includes a power divider and the phase shifter described above, where the phase shifter is connected to each branch of the power divider.

REFERENCE NUMERALS

10—Phase shifter 11—Reference structure 111—Substrate
112—Microstrip input/output port 113—Microstrip coupling structure
114—Microstrip transmission line 115—Microstrip/coplanar-waveguide coupling structure
1151—Microstrip 1152—Coplanar waveguide 1153—First metal layer
1154—First ground layer 116—Coplanar waveguide input/output port
1161—Second metal layer 1162—Second ground layer
12—Phase shift structure 20—Power divider 30—Feed network

DESCRIPTION OF EMBODIMENTS

To make the objectives, technical solutions, and advantages of the present invention clearer, the following further describes the present invention in detail with reference to the accompanying drawings. Apparently, the described embodiments are merely a part of rather than all of the embodiments of the present invention. All other embodiments obtained by a person of ordinary skill in the art based on the embodiments of the present invention without creative efforts shall fall within the protection scope of the present invention.

Figure 1:
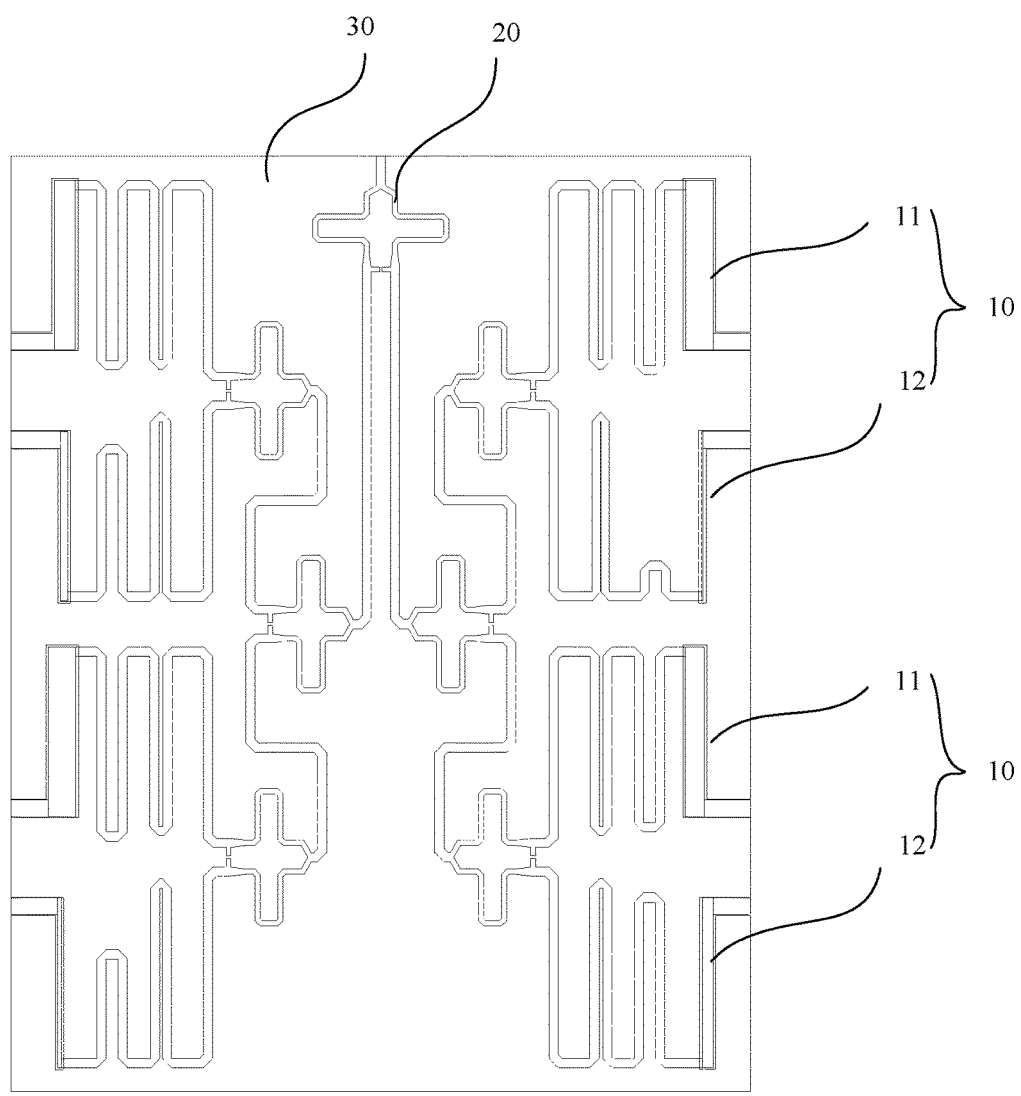
FIG. 1 is a schematic structural diagram of a feed network according to an embodiment of the present invention.
Figure 2:
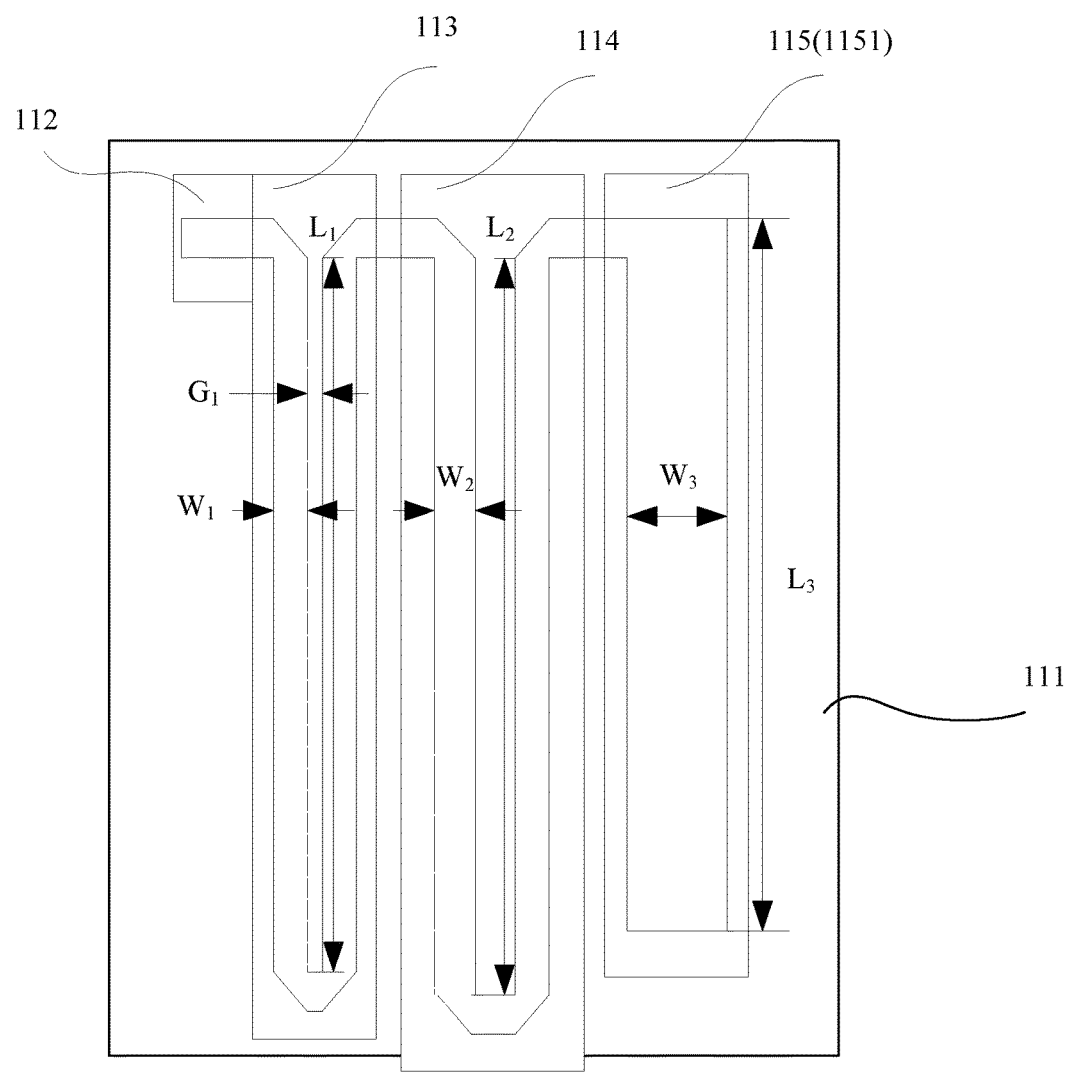
FIG. 2 is a schematic diagram of a top layer of a reference structure of a phase shifter according to an embodiment of the present invention.
Figure 3:
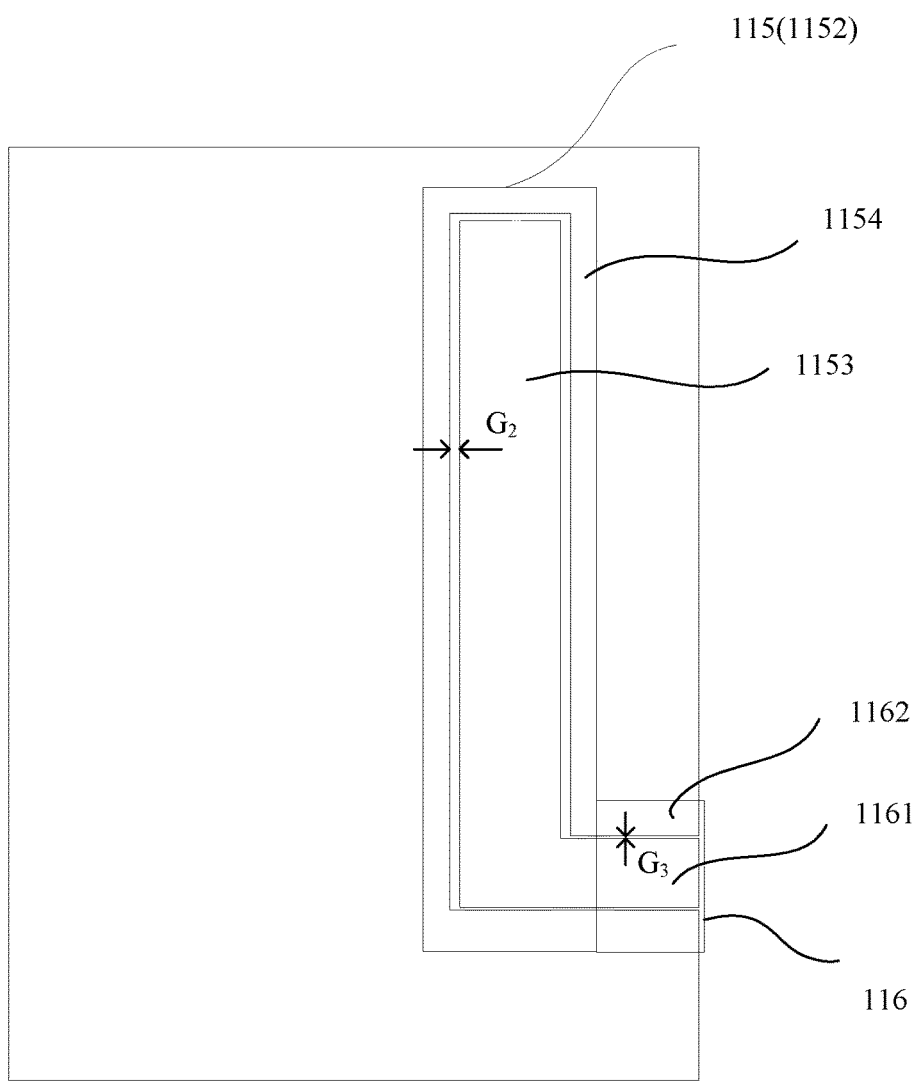
FIG. 3 is a schematic diagram of a bottom layer of a reference structure of a phase shifter according to an embodiment of the present invention.

For ease of understanding of a phase shifter provided in this embodiment, the following gives a detailed description with reference to specific embodiments and accompany drawings. Referring to FIG. 1, FIG. 2, and FIG. 3 together, FIG. 2 and FIG. 3 are schematic structural diagrams of a reference structure 11 of a phase shifter 10 shown in FIG. 1 provided in an embodiment of the present invention. FIG. 2 is a schematic diagram of top layer metal and FIG. 3 is a schematic diagram of bottom layer metal.

First, it should be noted that the phase shifter 10 provided in this embodiment may be applied to a feed network 30. As shown in FIG. 1, the feed network 30 is formed by connecting multiple phase shifters 10 by using a power divider 20. In addition, in a specific structure of the phase shifter 10, the phase shifter 10 includes at least one phase shift component. As shown in FIG. 1, the phase shift component includes: a substrate 111, a microstrip coupling structure 113 disposed on a first plane of the substrate 111, a microstrip transmission line 114 connected to the microstrip coupling structure 113 and disposed on the first plane, and a microstrip/coplanar-waveguide coupling structure 115. As shown in FIG. 3, the microstrip/coplanar-waveguide coupling structure 115 includes a microstrip connected to the microstrip transmission line 114 (FIG. 2) and disposed on the first plane and a coplanar waveguide 1152 disposed on a second plane of the substrate 111 and coupled with the microstrip, where the second plane is opposite to the first plane. During specific setting, the reference structure 11 and a phase shift structure 12 in the phase shifter 10 shown in FIG. 1 have same components but different design parameters.

In this embodiment shown in FIG. 1, the phase shifter 10 may include the reference structure 11 and the phase shift structure 12. The reference structure 11 and the phase shift structure 12 are both phase shift components and may be the same in structure but differ in design parameter values. The reference structure 11 is used as an example. The reference structure 11 includes the substrate 111, the microstrip coupling structure 113 disposed on the substrate 111, and the microstrip transmission line 114. The microstrip transmission line 114 is connected to the microstrip coupling structure 113. The substrate 111 may be a PCB (printed circuit board).

During specific setting, as shown in FIG. 2, the microstrip coupling structure 113 is formed by bending a microstrip. The microstrip coupling structure 113 is a U-shaped microstrip. To ensure coupling between two side walls of the U-shaped microstrip, a gap $G_1$ between the two side walls of the U-shaped microstrip is not greater than eight times a thickness of the substrate 111. In this way, coupling between two microstrips is ensured. As shown in FIG. 2, the U-shaped microstrip includes a U-shaped joint portion and two side walls that are separately connected to the joint portion. Each side wall may be considered as a microstrip. In addition, the microstrip coupling structure 113 has stronger coupling than that of the microstrip transmission line 114, and a resonance point is generated at a center frequency of a passband, improving performance of the passband. Using FIG. 2 as an example, in this embodiment, a length of the microstrip coupling structure 113 is $L_1$, a width of the microstrip is $W_1$, and a gap between two microstrips is $G_1$. During specific setting, for example, a characteristic impedance is 50 ohm and is determined by the coupling line width $W_1$ and the coupling gap $G_1$. It is assumed that the phase shifter 10 operates at a center frequency fc and a signal corresponding to the frequency fc has a wavelength λc in a dielectric of the substrate 111. Then, the length $L_1$ of the microstrip coupling structure is 0.25λc. In addition, to ensure coupling generated between the two side walls, a width (that is, $G_1$) between the two side walls is not greater than eight times the thickness of the substrate 111, for example, the width may be any multiple, such as twice, four times, six times, or eight times the thickness. A specific multiple may be determined according to practical design needs.

Still referring to FIG. 2, the microstrip transmission line 114 in this embodiment is connected to the microstrip coupling structure 113 and may be in any shape during specific setting. There is no coupling generated between parts of the microstrip transmission line 114. As shown in FIG. 2, the microstrip transmission line 114 provided in this embodiment may be set in different shapes, such as a U shape, a wave shape, a curve shape, and an irregular shape. No matter which setting is used, a total length of the microstrip transmission line 114 remains unchanged, for example, twice a length $L_2$ as shown in FIG. 2, and an impedance is 50 ohm. Because the microstrip transmission line 114 is U-shaped and a length of one transmission line of the microstrip transmission line 114 is $L_2$, a total length of the U-shaped microstrip transmission line 114 is $2L_2$. A coupling width of the microstrip transmission line 114 is $W_2$.

Referring to FIG. 2 and FIG. 3 together, the reference structure 11 in this embodiment further includes a microstrip/coplanar-waveguide coupling structure 115. The microstrip/coplanar-waveguide coupling structure 115 includes a microstrip 1151 (FIG. 2) and a coplanar waveguide 1152 (FIG. 2). The microstrip 1151 is connected to and coplanar with the microstrip transmission line 114, and the coplanar waveguide 1152 is disposed opposite to the microstrip 1151 on the substrate 111. Specifically, as shown in FIG. 2, in this embodiment, the microstrip 1151 is a microstrip that is $W_3$ wide and $L_3$ long. Referring to FIG. 3, the coplanar waveguide 1152 includes a first metal layer 1153 and a first ground layer 1154 located on two sides of the first metal layer 1153, and a first gap exists between the first metal layer 1153 and the first ground layer 1154. Referring to FIG. 3, a width of the first gap is $G_2$. When the microstrip 1151 is coupled with the first metal layer 1153, a coupling length $L_3$ is 0.25λc at a center frequency, where λc is a wavelength of a signal corresponding to the center frequency in the dielectric of the substrate 111. In addition, coupling between the microstrip 1151 and the first metal layer 1153 may be in different manners. Specifically, in the microstrip/coplanar-waveguide coupling structure 115, the microstrip 1151 and the first metal layer 1153 of the coplanar waveguide 1152 have completely overlapped, partially overlapped, or staggered vertical projections on a same plane. That is, when coupled, the microstrip 1151 and the first metal layer 1153 completely overlap, partially overlap, or are staggered. All of the foregoing three manners may implement coupling between the microstrip 1151 and the first metal layer 1153.

The reference structure 11 in this embodiment further includes a microstrip input/output port 112 (FIG. 2) connected to the microstrip coupling structure 113 and a coplanar waveguide input/output port 116 connected to the coplanar waveguide 1152. When the port 112 connected to the microstrip coupling structure 113 serves as an input port, the coplanar waveguide port 116 connected to the coplanar waveguide 1152 serves as an output port. Alternatively, when the port 112 connected to the microstrip coupling structure 113 serves as an output port, the coplanar waveguide port 116 connected to the coplanar waveguide 1152 serves as an input port. A specific setting depends on an actual connection status. Therefore, in the embodiments of the present invention, "input/output" represents at least one of input or output.

When the coplanar waveguide input/output port 116 is specifically connected to the coplanar waveguide 1152, the coplanar waveguide input/output port 116 includes a second metal layer 1161 and a second ground layer 1162 located on two sides of the second metal layer 1161, and a second gap exists between the second metal layer 1161 and the second ground layer 1162. As shown in FIG. 3, a width of the second gap is $G_3$. The first metal layer 1153 and the second metal layer 1161 are connected, the first ground layer 1154 and the second ground layer 1162 are connected, and the first gap and the second gap are connected, implementing a connection between the coplanar waveguide input/output port 116 and the coplanar waveguide 1152.

In addition, a capacitor may change a coupling strength of a coupling structure. Therefore, a capacitor may be set for each phase shifter 10 to fine-tune an output phase. During specific setting, a capacitor may be disposed in the microstrip coupling structure 113 or the microstrip/coplanar-waveguide coupling structure 115, or a capacitor may be disposed in each of the two coupling structures. Disposing a capacitor in the microstrip coupling structure 113 means connecting a capacitor between the two side walls of the U-shaped microstrip. Disposing a capacitor in the microstrip/coplanar-waveguide coupling structure 115 means disposing a capacitor between the microstrip 1151 and the coplanar waveguide 1152 (that is, between the microstrip 1151 and the first metal layer 1153). The capacitor may be a fixed capacitor, a variable capacitor, or a capacitor array. Specifically, coupling performance of the microstrip coupling structure 113 or the microstrip/coplanar-waveguide coupling structure 115 may be changed by using the disposed capacitor, that is, a phase shift of each output branch may be fine-tuned by using the disposed capacitor, so as to further change a phase output of the phase shifter 10.

In this embodiment, during input and output setting, either an input or an output is connected to the microstrip coupling structure 113, and the other is connected to the coplanar waveguide. In addition, during specific setting, an impedance of the microstrip input/output port 112 is 50 ohm, and an impedance of the coplanar waveguide input/output port 116 is 50 ohm.

In this embodiment, the reference structure 11 and the phase shift structure 12 have same components but differ in component size. Therefore, for the phase shift structure 12, reference may be made to a structure of the foregoing reference structure 11, and components of the phase shift structure 12 are not described herein again.

The reference structure 11 and the phase shift structure 12 may be specifically set by referring to the following principle: When it is ensured that a characteristic impedance of the microstrip coupling structure 113 is 50 ohm, a phase response slope m of the phase shifter 10 may be increased by reducing both the coupling gap $G_1$ and the coupling width $W_1$ of the microstrip coupling structure 113 and a coupling width $W_3$ of the microstrip/coplanar-waveguide coupling structure 115. (Note: The phase response slope m can be increased by reducing the coupling gap $G_1$ and the coupling width $W_1$ of the microstrip coupling structure 113 or by reducing the coupling width $W_3$ of the microstrip/coplanar-waveguide coupling structure 115. Use of both structures is intended to implement a greater differential phase shift and better passband performance).

$$m = \frac{\Phi a - \Phi b}{fa - fb},$$

where fa and fb are two frequency channel numbers within an operating frequency band, and Φa and Φb are phase responses of the phase shifter 10 corresponding to the frequency channel numbers fa and fb.

Figure 4:
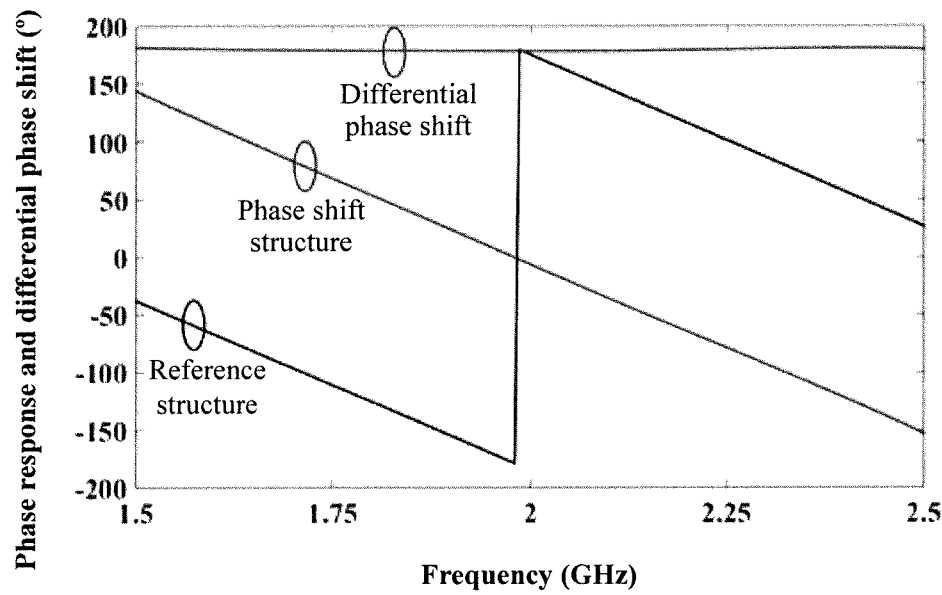
FIG. 4 is a schematic diagram of phase responses of a phase shifter according to an embodiment of the present invention.

Further, by reducing the length of the microstrip transmission line, a phase response slope m of the phase shift structure 12 and a phase response (in °) vs. Frequency in GHz slope m of the reference structure 11 are made equal within the operating frequency band. Details are shown in FIG. 4. FIG. 4 is a schematic diagram of a phase response of the phase shift structure 12. After the foregoing changes, phase responses of the reference structure 11 and the phase shift structure 12 are parallel within the operating frequency band, and the reference structure 11 and the phase shift structure 12 have different phase responses. A phase response difference between the two structures is a differential phase shift, and the differential phase shift is a relatively fixed value.

A phase shifter 10 with a 5.625°, 11.25°, 22.5°, 45°, 90°, or 180° phase shifts (see FIG. 5) relative to the reference structure 11 can be designed based on the foregoing principle. In addition, because the reference structure 11 and the phase shift structure 12 have parallel phase responses within the passband, the phase shift structure 12 may be considered as the reference structure 11 to implement a differential phase shift of another angle. For example, when a phase shift structure with a 5.625° phase shift is used as the reference structure 11 and a phase shift structure with a 180° phase shift is used as the phase shift structure 12, a differential phase shift of 180°−5.625°=174.375° is generated.

Figure 5:
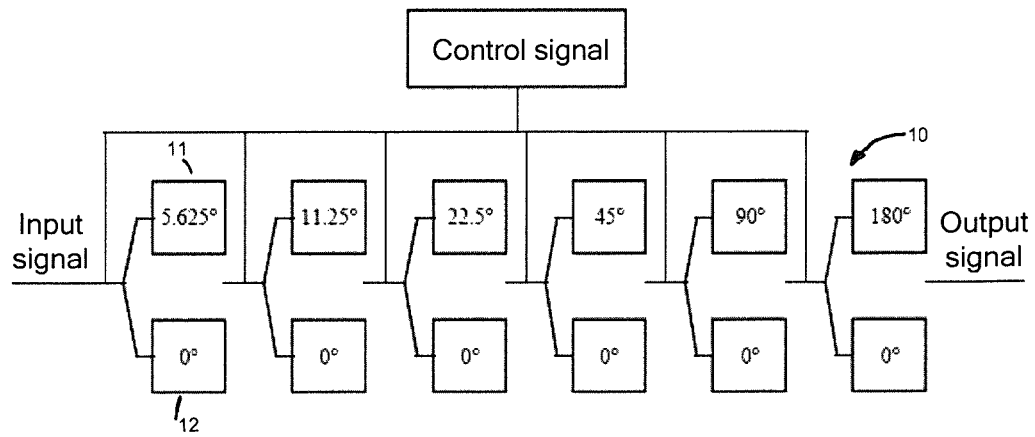
FIG. 5 is a schematic diagram of a 6-bit digitally-controlled phase shifter according to an embodiment of the present invention.

As shown in FIG. 5, the phase shifter 10 designed provided in this implementation solution may be changed into a 6-bit digitally-controlled phase shifter 10 with a phase shift range up to 360° by means of control circuit cascading. In the figure, 0° represents the reference structure 11 and 5.625° represents the phase shift structure 12. By means of controlling by a control signal selection of different branches for an input signal, an adjustable phase shifter 10 with a 5.625° resolution can be implemented.

It can be learned from the preceding description that in the phase shifter 10, both the reference structure 11 and the phase shift structure 12 in this embodiment include the microstrip coupling structure 113, the microstrip transmission line 114, and the microstrip/coplanar-waveguide coupling structure 115. The reference structure 11 and the phase shift structure 12 may have different phases by changing a coupling width and a coupling gap of the microstrip coupling structure 113, a length of the microstrip transmission line 114, or a coupling width of the microstrip/coplanar-waveguide coupling structure 115. This makes an adjustment of a phase shift angle (that is, a phase shift value) convenient. In addition, phase shifters 10 using the microstrip/coplanar-waveguide coupling structure 115 have a small volume and cost low. This helps to ensure that all the phase shifters 10 are of a same size, and facilitates design of a feed network 30.

Still referring to FIG. 1, the feed network 30 provided in an embodiment of the present invention includes a power divider 20 and any of the foregoing phase shifter 10, where the phase shifter 10 is connected to each branch of the power divider 20.

In a specific embodiment, the designed phase shifters 10 are connected by an 8-channel power divider 20 in a particular manner to form a feed network 30 with a phase shift feature, so as to implement a multi-channel multi-phase-shift output function. The feed network 30 includes but is not limited to an 8-port output shown in FIG. 1. A manner of a connection between the power divider 20 and the phase shifters 10 is not limited to that shown in FIG. 1 and may be selected flexibly according to requirements. It can be learned from FIG. 1 that, regardless of phase differences of the phase shifters 10 using a microstrip/coplanar-waveguide coupling structure 115, the phase shifters 10 have a same size, thereby facilitating setting of the feed network 30.

Figure 6:
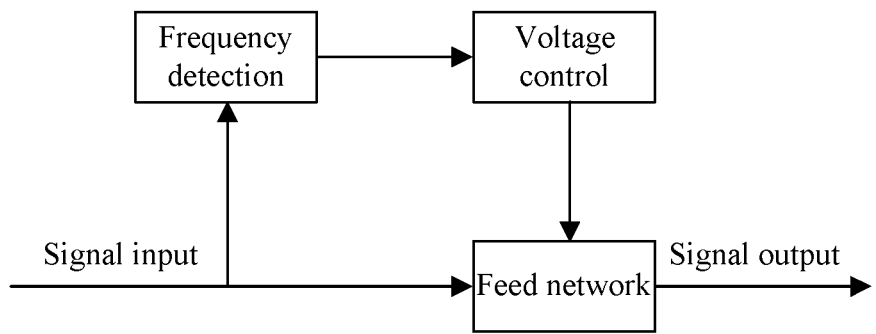
FIG. 6 is a schematic diagram of a frequency detection manner of a feed network according to an embodiment of the present invention.
Figure 7:
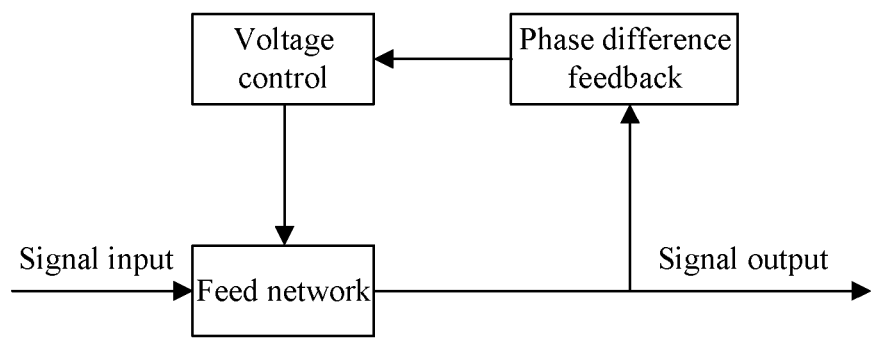
FIG. 7 is a schematic diagram of a phase feedback manner of a feed network according to an embodiment of the present invention.

In addition, a capacitor is disposed in the phase shifter 10 in this embodiment to facilitate a phase response adjustment for the phase shifters 10 on the feed network 30. Specifically, a capacitor or a capacity array (the capacitor and the capacitor array may be a fixed capacitor, a variable capacitor, or a combination thereof) is connected on the feed network 30 in the embodiment of the present invention, to implement phase shift fine-tuning for each output branch. Because the capacitor can change a coupling strength of a coupling structure, an output phase of each branch can be fine-tuned. An accurate phase shift within a frequency band can be implemented in two manners: a frequency detection manner and a phase feedback manner. FIG. 6 and FIG. 7 are schematic diagrams of the frequency detection manner and the phase feedback manner.

As shown in FIG. 6, in the frequency detection manner, a frequency of an input signal is detected, to determine a capacitance required by each branch to achieve an accurate phase shift for the frequency, and then a voltage control module is used to adjust a voltage to a level matching the capacitance, so as to implement an accurate phase shift for the frequency. The voltage is applied to the feed network 30, and specifically, to the capacitor. The capacitor may be a capacitor array of fixed or variable capacitors. A capacitance of the entire array can be changed by means of voltage-based control of the array. A capacitance change further affects a coupling strength, thereby changing a phase response and implementing a phase adjustment. An accurate phase shift within a frequency band can be implemented through frequency detection in a frequency band range.

As shown in FIG. 7, in the phase feedback manner, a difference between a phase shift of an output signal and a required ideal phase shift is detected, a capacitance required by each branch is determined based on the difference, and a voltage control module is used to adjust a voltage to a level matching the capacitance required by the branch, so as to implement an accurate phase shift for a frequency. The voltage is applied to the feed network 30, and specifically, to the capacitor. The capacitor may be a capacitor array of fixed capacitors or variable capacitors. A capacitance of the entire array can be changed by means of voltage-based control of the array. A capacitance change further affects a coupling strength, thereby changing a phase response and implementing a phase adjustment. An accurate phase shift within a frequency band can be implemented through phase feedback monitoring in a frequency band range.

Figure 8:
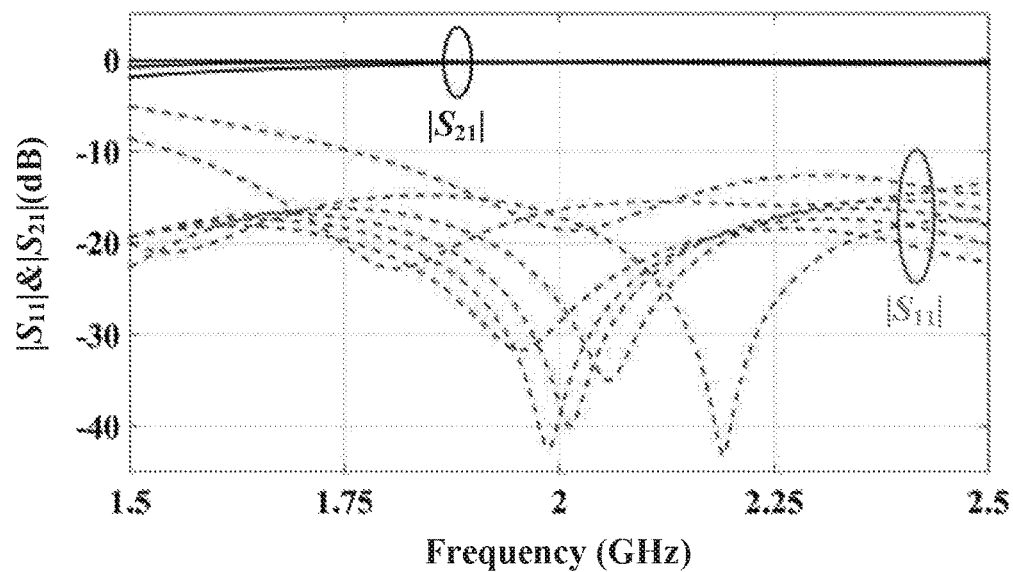
FIG. 8 is a schematic diagram of simulated frequency responses of phase shifters on a feed network according to an embodiment of the present invention.
Figure 9:
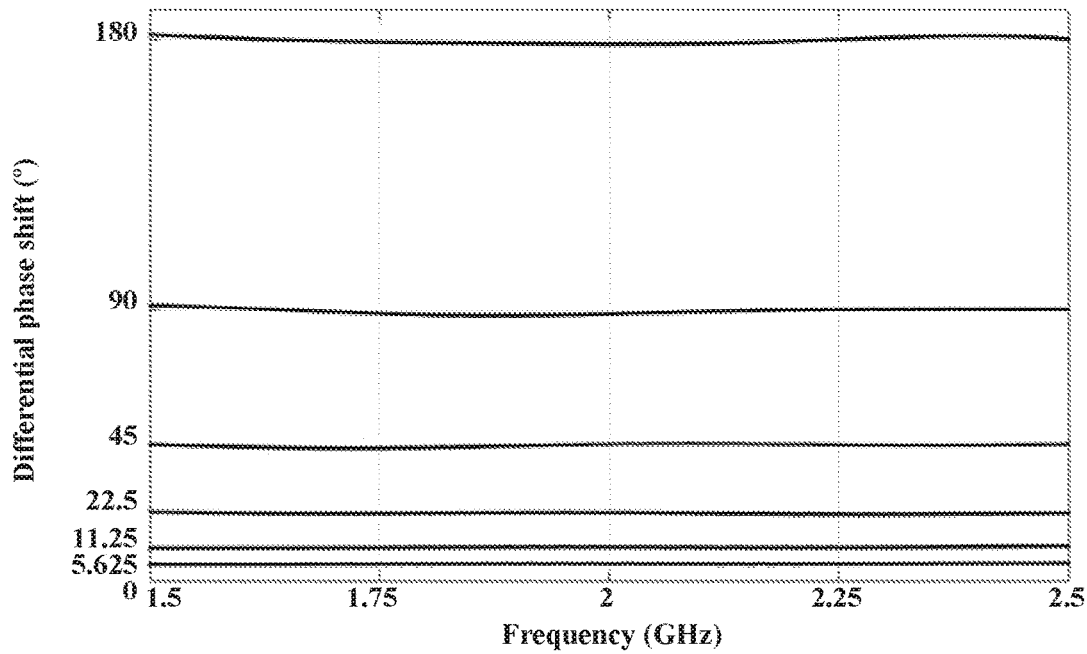
FIG. 9 is a schematic diagram of simulated differential phase shifts of phase shifters on a feed network according to an embodiment of the present invention.

In an example, phase shifters 10 using a microstrip/coplanar-waveguide coupling structure 115 have a same size, that is, 32 mm×38 mm (0.28 λg×0.35 λg, where λg is a wavelength of a signal corresponding to a center frequency in a dielectric of a substrate 111). Simulation results of the phase shifters 10 are shown in FIG. 8 and FIG. 9. FIG. 8 shows simulated frequency responses (i.e. $|S_{11}|$ and $|S_{21}|$ in dB v. Frequency in GHz) of the phase shifters 10, and FIG. 9 shows simulated differential phase shifts (in °) vs. Frequency in GHz of the phase shifters 10. On condition that a relatively high phase shift accuracy is ensured, a center frequency is 2 GHz, a frequency range is 1.5 GHz-2.5 GHz, and a relative bandwidth reaches 50% for a passband of each phase shifter 10. Table 1 presents maximum phase shift errors for each phase angle (FIG. 9).

TABLE 1

| Maximum phase shift errors of phase shifters 10 | | | | | | |
|---|---|---|---|---|---|---|
| Differential phase shift | 5.625° | 11.25° | 22.5° | 45° | 90° | 180° |
| Maximum phase shift error | 0.225° | 0.4° | 0.47° | 1° | 1.92° | 1.6° |

Figure 10:
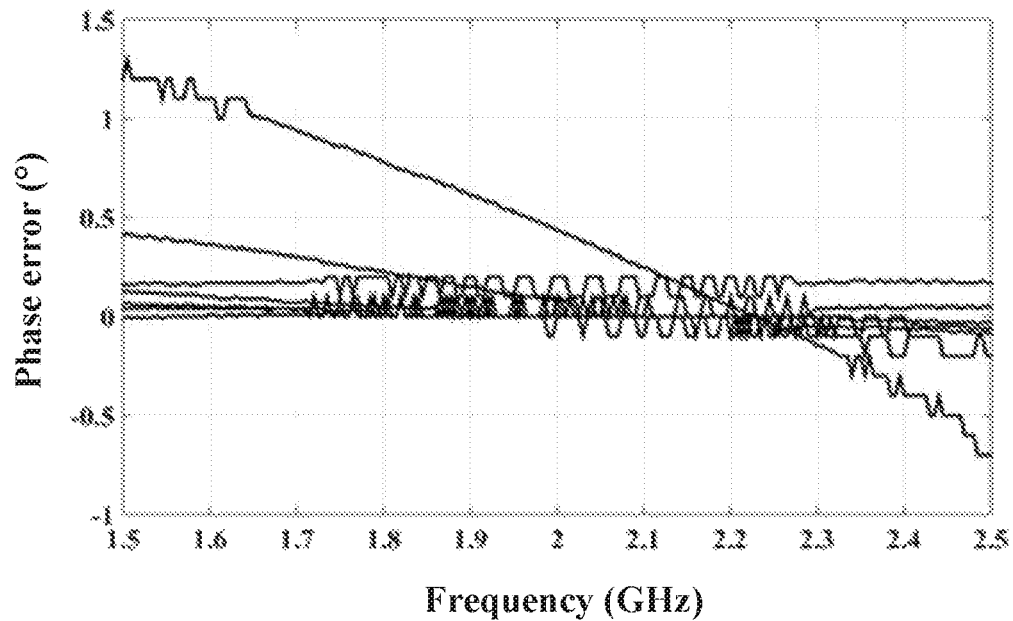
FIG. 10 is a schematic diagram of phase errors caused by increasing a coupling width $W_1$ of a microstrip coupling structure of a phase shifter by 0.01 mm according to an embodiment of the present invention.

In addition, engineering errors are simulated by increasing the width $W_1$ (as shown in FIG. 2) of the microstrip/coplanar-waveguide coupling structure 115 in each phase shifter 10 by 0.01mm. FIG. 10 shows phase error results (in °) vs. Frequency in GHz. Except that the 0.01 mm engineering error causes a relatively large phase error to a 180° phase shift structure due to a small value of $W_1$ (as shown in the phase shift structure 12 in FIG. 1), phase errors of other phase shift structures are within 0.4°. An engineering error has a minor impact on a differential phase of the phase shifter 10. Table 2 lists a specific phase error range of each phase.

TABLE 2

| Phase error ranges caused by increasing $W_1$ by 0.01 mm | | | | | | | |
|---|---|---|---|---|---|---|---|
| Angle | 0° | 5.625° | 11.25° | 22.5° | 45° | 90° | 180° |
| Phase error range (°) | −0.1~0.1 | 0.1~0.2 | −0.01~0.1 | −0.1~0.1 | −0.1~0.13 | −0.2~0.42 | −0.7~1.3 |

Figure 11:
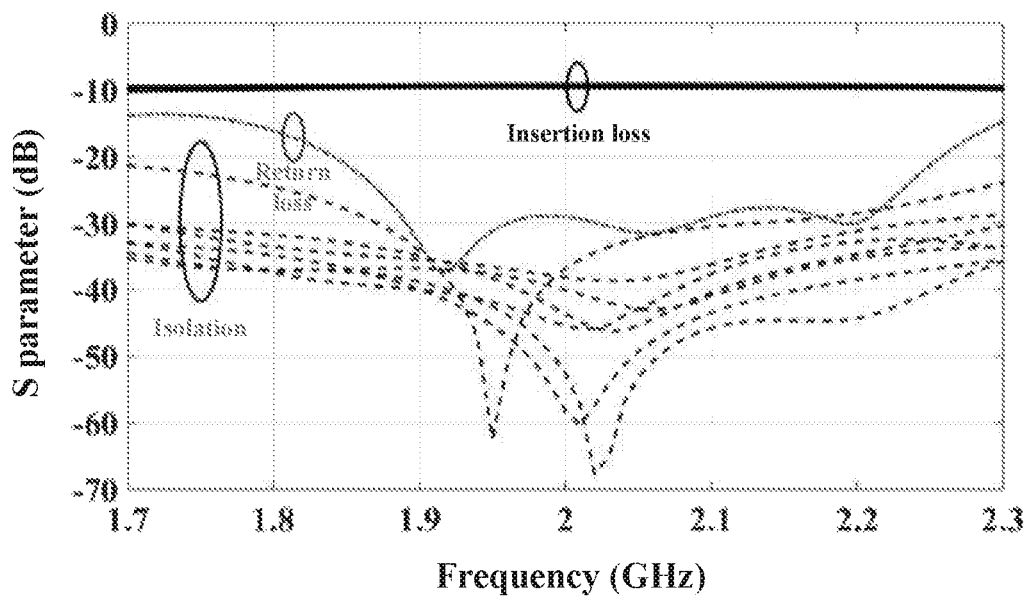
FIG. 11 is a schematic diagram of simulated frequency responses of phase shifters on a feed network according to an embodiment of the present invention.
Figure 12:
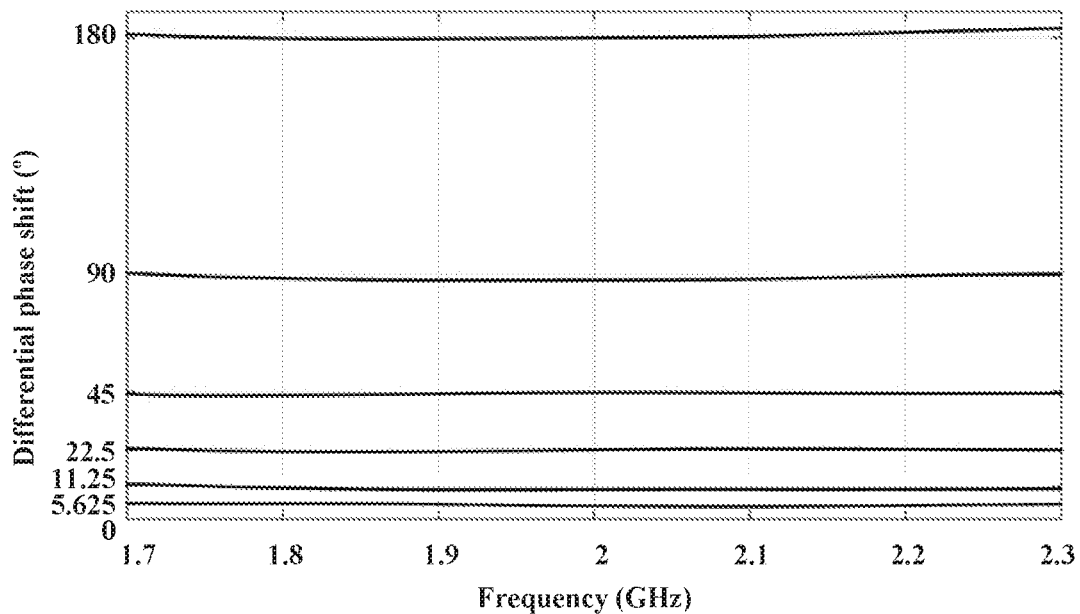
FIG. 12 is a schematic diagram of simulated differential phase shifts of phase shifters on a feed network according to an embodiment of the present invention.

FIG. 11 and FIG. 12 show simulation results of a phase shift feed network 30 having a phase shift feature, where the phase shift feed network 30 includes the designed phase shifters 10 and an 8-channel power divider 20. FIG. 11 illustrates simulated frequency responses (i.e., S parameters in dB vs. Frequency in GHz) of the phase shift feed network 30 and illustrates an insertion loss (see also FIG. 13), and FIG. 12 illustrates simulated differential phase shifts (in °) vs. Frequency in GHz of the phase shift feed network 30. For the feed network 30, a center frequency is 2 GHz, a frequency range is 1.7 GHz-2.3 GHz, and a relative bandwidth is 30%. A return loss (FIG. 11) within a passband is below −15 dB, and an isolation (FIG. 11) between ports is above 20 dB. Table 3 lists maximum phase shift errors of each differential phase shift guide angle (FIG. 12) of the feed network 30.

TABLE 3

| Maximum phase shift errors of a feed network | | | | | | |
|---|---|---|---|---|---|---|
| Differential phase shift | 5.625° | 11.25° | 22.5° | 45° | 90° | 180° |
| Maximum phase shift error | 0.711° | 1.51° | 0.767° | 1.6° | 2.51° | 3.6° |

To verify the simulation results, an 8-channel phase-shift feed network is tested in an example. FIG. 1 shows the 8-channel phase-shift feed network. In the design, a Rogers 5880 dielectric substrate is used. The Rogers 5880 dielectric substrate has a small relative dielectric constant and a small dielectric loss angle, delivering good passband performance. Because the feed network is large in size while the dielectric substrate is thin, if the entire substrate of the phase-shift feed network is directly used for testing, the substrate will be bent. To reduce a test error caused by substrate bending, a 5 mm-thick aluminum plate is used as a fastening plate during measurement, and grooving processing is performed at a coplanar waveguide output port, to avoid affecting test performance. In addition, because the phase-shift feed network is a multi-port circuit, during the test, a 50-ohm matched load needs to be connected to an unused port to implement port impedance matching.

Figure 13:
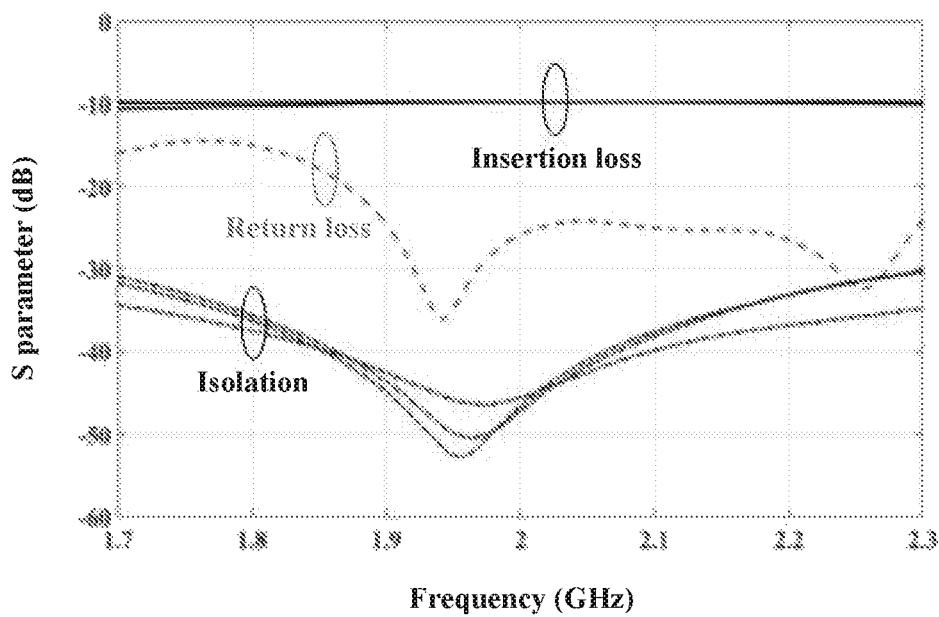
FIG. 13 illustrates a frequency response test result of an 8-channel phase shift feed network according to an embodiment of the present invention.
Figure 14:
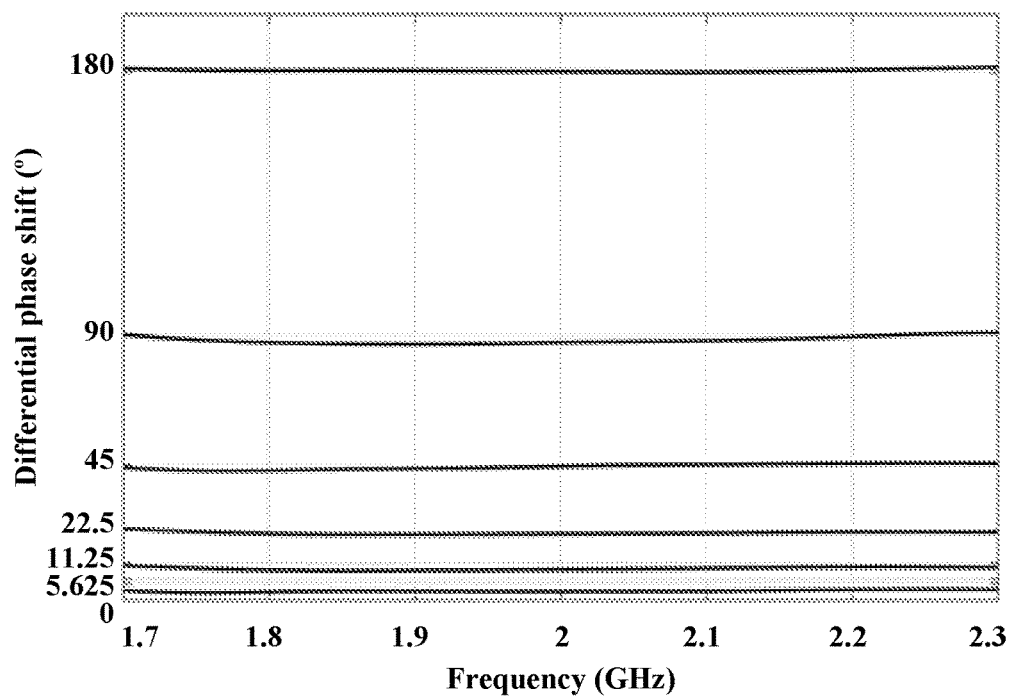
FIG. 14 illustrates a differential phase shift test result of an 8-channel phase shift feed network according to an embodiment of the present invention.

FIG. 13 and FIG. 14 respectively show a frequency response (i.e., S parameters in dB vs. Frequency in GHz)test result and a differential phase shift (in °) vs. Frequency in GHz result of an 8-channel phase-shift feed network. It can be learned from the frequency response test result that, the center frequency is 2 GHz, the operating frequency band is 1.7 GHz-2.3 GHz, and the relative bandwidth is 30% for the 8-channel phase-shift feed network. An insertion loss (FIG. 13) range of each port is −9.6 dB to −10 dB, a return loss (FIG. 13) of the entire phase-shift feed network is below −14.4 dB, and an isolation (FIG. 13) is above 30 dB. Table 4 presents a maximum phase shift error of each differential phase shift angle (FIG. 14) of the phase-shift feed network.

TABLE 4

| Maximum phase shift errors in a phase-shift feed network test | | | | | | |
|---|---|---|---|---|---|---|
| Differential phase shift | 5.625° | 11.25° | 22.5° | 45° | 90° | 180° |
| Maximum phase shift error | 2.98° | 2.71° | 1.52° | 2.12° | 3.54° | 1.76° |

The test results are basically consistent with simulation results. It can be learned from the foregoing description that on the feed network 30 provided in this embodiment, the microstrip/coplanar-waveguide coupling structure 115 is used to implement the phase shifter 10, and the microstrip coupling structure is added to the phase shifter 10 to improve passband performance. Further, a capacitor or a capacity array (the capacitor and capacitor array may be a fixed capacitor, a variable capacitor, or a combination thereof) is connected to the microstrip coupling structure 113 and the microstrip/coplanar-waveguide coupling structure 115 to implement a phase adjustment.

It should be understood that the phase shifter provided in this embodiment may be applied not only to a feed network, but also to other fields. Specifically, by switching to another frequency band by means of a size change, the phase shifter may be applied to another field of a different frequency, such as an active circuit and a system application. The phase shifter may be used in various communications systems, such as an MIMO and a phase array. Together with a power amplifier, an oscillator, a low noise amplifier, or the like, the phase shifter can be used in a communication transceiver system or a frequency generator system. Together with an antenna, the phase shifter can be used in a phase array antenna or a phase array radar.

Obviously, a person skilled in the art can make various modifications and variations to the present invention without departing from the spirit and scope of the present invention. The present invention is intended to cover these modifications and variations provided that they fall within the scope of protection defined by the following claims and their equivalent technologies.

What is claimed is:

1. A phase shifter, comprising:
   at least one phase shift component, wherein the at least one phase shift component comprises,
      a substrate,
      a microstrip coupling structure disposed on a first plane of the substrate,
      a microstrip transmission line connected to the microstrip coupling structure and disposed on the first plane,
      a microstrip/coplanar-waveguide coupling structure, wherein the microstrip/coplanar-waveguide coupling structure comprises,
         a microstrip connected to the microstrip transmission line and disposed on the first plane, and
         a coplanar waveguide disposed on a second plane of the substrate opposite to the microstrip of the microstrip/coplanar-waveguide coupling structure disposed on the first plane and coupled with the microstrip of the microstrip/coplanar-waveguide coupling structure, wherein one or more vertical projections of a first metal layer of the coplanar waveguide and one or more vertical projections of the microstrip of the microstrip/coplanar-waveguide coupling structure, completely overlap, partially overlap, or are staggered; and
      a microstrip input/output port connected to the microstrip coupling structure, and a coplanar waveguide input/output port connected to the coplanar waveguide,
   wherein a phase shift generated from a signal passing between the microstrip input/output port and the coplanar waveguide input/output port is a phase shift of the at least one phase shift component.

2. The phase shifter according to claim 1, wherein the microstrip coupling structure is a U-shaped microstrip.

3. The phase shifter according to claim 2, wherein a coupling width between two side walls of the U-shaped microstrip is not greater than eight times a thickness of the substrate.

4. The phase shifter according to claim 2, further comprising a capacitor disposed in and coupled between the two side walls of the U-shaped microstrip.

5. The phase shifter according to claim 2, wherein a side wall length of the U-shaped microstrip is $0.25\lambda c$, wherein when the phase shifter operates at a center frequency of fc, $\lambda c$ is a wavelength of a signal whose frequency is fc and that is transmitted over a substrate dielectric.

6. The phase shifter according to claim 1, wherein the coplanar waveguide comprises,
   a first metal layer and a first ground layer located on two sides of the first metal layer, and a first gap exists between the first metal layer and the first ground layer; and
   the coplanar waveguide input/output port comprises,
      a second metal layer and a second ground layer located on two sides of the second metal layer, and a second gap exists between the second metal layer and the second ground layer,
   wherein the first metal layer and the second metal layer are connected, the first ground layer and the second ground layer are connected, and the first gap and the second gap are connected.

7. The phase shifter according to claim 1, wherein the at least one phase shift component comprises a plurality of phase shift components including a reference phase shift structure and a phase shift structure;
   the reference phase shift structure, serving as a first phase shift component, is configured to generate a first phase shift; and
   the phase shift structure, serving as a second phase shift component, is configured to generate a second phase shift, wherein the first phase shift and the second phase shift are used to generate a differential phase shift, and the differential phase shift is a phase shift of the phase shifter.

8. The phase shifter according to claim 1, further comprising a capacitor disposed in and coupled between the microstrip and the coplanar waveguide, of the microstrip/coplanar-waveguide coupling structure.

9. A feed network, comprising:
   a power divider and a phase shifter connected to each branch of the power divider;
   wherein the phase shifter comprises at least one phase shift component,
   wherein the at least one phase shift component comprises:
      a substrate,
      a microstrip coupling structure disposed on a first plane of the substrate,
      a microstrip transmission line connected to the microstrip coupling structure and disposed on the first plane,
      a microstrip/coplanar-waveguide coupling structure, wherein the microstrip/coplanar-waveguide coupling structure comprises,
         a microstrip connected to the microstrip transmission line and disposed on the first plane, and
         a coplanar waveguide disposed on a second plane of the substrate opposite to the microstrip of the microstrip/coplanar-waveguide coupling structure disposed on the first plane and coupled with the microstrip of the microstrip/coplanar-waveguide coupling structure, wherein one or more vertical projections of a first metal layer of the coplanar waveguide and one or more vertical projections of the microstrip of the microstrip/coplanar-waveguide coupling structure, completely overlap, partially overlap, or are staggered; and a microstrip input/output port connected to the microstrip coupling structure and a coplanar waveguide input/output port connected to the coplanar waveguide, wherein a phase shift generated from a signal passing between the microstrip input/output port and the coplanar waveguide input/output port is a phase shift of the at least one phase shift component.

10. The feed network according to claim 9, wherein the at least one phase shift component comprises a plurality of phase shift components including a reference phase shift structure and a phase shift structure;

the reference phase shift structure, serving as a first phase shift component, is configured to generate a first phase shift; and the phase shift structure, serving as a second phase shift component, is configured to generate a second phase shift, wherein the first phase shift and the second phase shift are used to generate a differential phase shift, and the differential phase shift is a phase shift of the phase shifter.

11. The feed network according to claim 9, wherein the microstrip coupling structure is a U-shaped microstrip.

12. The feed network according to claim 11, wherein a coupling width between two side walls of the U-shaped microstrip is not greater than eight times a thickness of the substrate.

13. The feed network according to claim 11, further comprising a capacitor coupled disposed in and between the two side walls of the U-shaped microstrip.

14. The feed network according to claim 11, wherein a side wall length of the U-shaped microstrip is $0.25\lambda c$, wherein when the phase shifter operates at a center frequency of fc, $\lambda c$ is a wavelength of a signal whose frequency is fc and that is transmitted over a substrate dielectric.

15. The feed network according to claim 9, wherein the coplanar waveguide comprises a first metal layer and a first ground layer located on two sides of the first metal layer, and a first gap exists between the first metal layer and the first ground layer; and the coplanar waveguide input/output port comprises
a second metal layer and a second ground layer located on two sides of the second metal layer, and a second gap exists between the second metal layer and the second ground layer,
wherein the first metal layer and the second metal layer are connected, the first ground layer and the second ground layer are connected, and the first gap and the second gap are connected.

16. The feed network according to claim 9, further comprising a capacitor disposed in and coupled between the microstrip and the coplanar waveguide, of the microstrip/coplanar-waveguide coupling structure.

* * * * *